US011056671B2

(12) United States Patent
Zheng

(10) Patent No.: US 11,056,671 B2
(45) Date of Patent: Jul. 6, 2021

(54) BACKPLATE HAVING GRAPHENE LAYER ON POLYETHYLENE TEREPHTHALATE LAYER AND FLEXIBLE DISPLAY PANEL THEREOF

(71) Applicant: WUHAN CHINA STAR OPTOELECTRONICS SEMICONDUCTOR DISPLAY TECHNOLOGY CO., LTD., Hubei (CN)

(72) Inventor: Changpin Zheng, Hubei (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 25 days.

(21) Appl. No.: 16/493,527

(22) PCT Filed: Apr. 17, 2019

(86) PCT No.: PCT/CN2019/082960
§ 371 (c)(1),
(2) Date: Sep. 12, 2019

(87) PCT Pub. No.: WO2020/155407
PCT Pub. Date: Aug. 6, 2020

(65) Prior Publication Data
US 2020/0280019 A1    Sep. 3, 2020

(30) Foreign Application Priority Data
Jan. 30, 2019    (CN) .......................... 201910093570.2

(51) Int. Cl.
*H01L 51/52*    (2006.01)
*H01L 27/32*    (2006.01)
(Continued)

(52) U.S. Cl.
CPC ........ *H01L 51/5246* (2013.01); *H01L 27/323* (2013.01); *H01L 51/0008* (2013.01); *H01L 51/56* (2013.01); *H01L 2251/5338* (2013.01)

(58) Field of Classification Search
CPC . H01L 51/5246; H01L 51/0008; H01L 51/56; H01L 27/323; H01L 2251/5338
See application file for complete search history.

(56) References Cited

U.S. PATENT DOCUMENTS

| 2012/0282419 | A1* | 11/2012 | Ahn | ....................... B82Y 40/00 |
| | | | | 428/34.8 |
| 2016/0164038 | A1* | 6/2016 | Shin | .................... H01L 51/5268 |
| | | | | 257/40 |

(Continued)

FOREIGN PATENT DOCUMENTS

| CN | 203757525 U | 8/2014 |
| CN | 205507734 U | 8/2016 |

(Continued)

*Primary Examiner* — Michael Jung

(57) ABSTRACT

The present disclosure provides a backplate and a flexible display panel thereof. Wherein the backplate includes a polyethylene terephthalate (PET) layer, and a graphene layer disposed on the PET layer. The present disclosure provides a backplate, which adopts a novel hierarchical structure design of graphene material, so that it realizes function of a current backplate while adding new heat dissipation functions. Compared with the current flexible display panel, the flexible display panel reduced a corresponding heat dissipation function layer, therefore having an effectively reduced thickness, and improved folding performance.

5 Claims, 1 Drawing Sheet

(51) Int. Cl.
    *H01L 51/00*     (2006.01)
    *H01L 51/56*     (2006.01)

(56) References Cited

U.S. PATENT DOCUMENTS

| | | | |
|---|---|---|---|
| 2017/0133596 A1* | 5/2017 | Kwon | G02B 5/0242 |
| 2018/0047938 A1* | 2/2018 | Kishimoto | H01L 27/323 |
| 2018/0113512 A1* | 4/2018 | Kang | G06F 3/04817 |
| 2019/0278411 A1* | 9/2019 | Jeon | G06F 1/1643 |

FOREIGN PATENT DOCUMENTS

| | | |
|---|---|---|
| CN | 106526927 A | 3/2017 |
| CN | 207096633 U | 3/2018 |
| CN | 108828838 A | 11/2018 |
| CN | 208173609 U | 11/2018 |
| CN | 109283611 A | 1/2019 |

* cited by examiner

BACKPLATE HAVING GRAPHENE LAYER ON POLYETHYLENE TEREPHTHALATE LAYER AND FLEXIBLE DISPLAY PANEL THEREOF

FIELD OF DISCLOSURE

The present disclosure relates to the field of illuminating display technology, in particular to a backplate and a flexible display panel thereof.

BACKGROUND OF DISCLOSURE

It is known that with the continuous development of flexible organic light emitting diode (OLED) display panel technology, flexible foldable products have begun to gradually enter the market. Because of its foldable performance, its display panel can be adjusted in size. When needed, the display is expanded display, the display area is larger and when unneeded, the display is folded placed, which makes the flexible foldable products become a mainstream market trend.

Please refer to FIG. 3, which illustrates a structure of a current flexible OLED display panel in the market. It mainly includes: a glass layer (cover glass) 400', a touch layer (TP-POL) 300', an OLED device layer 200', a backplate (BP) layer, and a heat dissipation sponge copper (Cu-foam) layer 500'.

Although structure in current flexible display panel products can realize flexible folding of a panel. However, due to its many functional layers, its overall thickness is relatively thick, resulting in a large elastic modulus and not easy to bend. Therefore, there is still a large difficulty in achieving folding performance, so thinning the display module becomes an important issue of the flexible foldable products. Moreover, when the structure of product in the current flexible display panels are prepared, there are also many issues in that the number of stacked layers of a functional structure module is large, resulting in a complicated process flow.

Therefore, it is indeed necessary to develop a new type of flexible display panel to overcome the drawbacks of the prior art.

SUMMARY OF DISCLOSURE

An aspect of the present disclosure is to provide a backplate that adopts a hierarchical structure design of novel material, so that it realizes a function of a current backplate while adds new functions. Compared with the current flexible display panel, the flexible display panel reduced a corresponding heat dissipation function layer, therefore have an effectively reduced thickness, and improving a folding performance.

The technical solutions adopted by the present disclosure are as follows:

A backplate comprising a polyethylene terephthalate (PET) layer, wherein a graphene layer disposed on the PET layer.

Further, in different embodiments, wherein the graphene layer is formed on the PET layer by a deposition method. Specifically, the deposition method may be low pressure chemical vapor deposition method or standard atmospheric pressure chemical vapor deposition method.

Further, in different embodiments, wherein a pressure sensitive adhesive layer disposed on the graphene layer.

Further, in different embodiments, a first release film layer disposed on the pressure sensitive adhesive layer, wherein the first release film layer is preferably an easy release film layer, but is not limited thereto.

Further, in different embodiments, a second release film layer disposed under the PET layer, wherein the second release film layer is preferably a heavy release film layer, but not limited thereto.

The easy and heavy release film layers are classified according to a size of a commonly used "release force" in the industry. This classification standard is a well-known standard in the industry and will not be described here.

Further, still another aspect of the present disclosure provides a flexible display panel including the backplate according to the present disclosure.

Further, the flexible display panel is composed of the backplate and an organic light emitting diode (OLED) layer, a touch layer and a glass layer, which are sequentially disposed on the backplate.

Compared with the prior art, the present disclosure has beneficial effects that: the present disclosure relates to a backplate and a flexible display panel thereof, wherein the backplate is provided with a novel material layer, the graphene layer, on the PET layer. So that the backplate has the function of the current backplate while additionally realizes the heat dissipation function. A thickness of the graphene layer is extremely limited compared to a thickness of the backplate. The graphene layer in the backplate can realizes the heat dissipation function, as like the current heat dissipation sponge copper layer of the current backplate in the current flexible display panel can realizes the heat dissipation function. Compared with the current flexible display panel, the flexible display panel have an effectively reduced thickness, thereby reducing an elastic modulus to a certain degree, and correspondingly improving a folding performance.

Further, the flexible display panel is no longer required to provide with the heat dissipation sponge copper layer, which also reduces a manufacturing cost of the flexible display panel in a certain degree, and correspondingly simplifies a preparation process thereof.

DESCRIPTION OF DRAWINGS

In order to more clearly illustrate the technical solutions in the embodiments of the present disclosure, the drawings used in the description of the embodiments will be briefly described below. It is obvious that the drawings in the following description are only some embodiments of the present disclosure. Other drawings can also be obtained from those skilled in the art based on these drawings without paying any creative effort.

DETAILED DESCRIPTION OF PREFERRED EMBODIMENTS

Accompany with drawings and embodiments, the technical solutions of a backplate and a flexible display panel thereof in present disclosure will be further described in detail.

Figure 1:
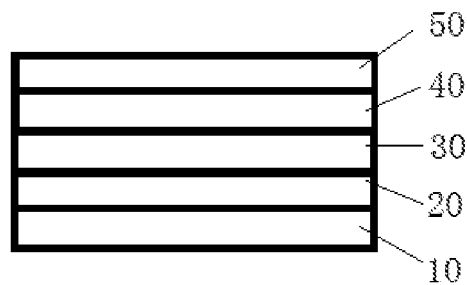
FIG. 1 is a schematic structural figure of a backplate according to an embodiment of the present disclosure.

Referring to FIG. 1, an embodiment of the present disclosure provides a backplate including a heavy release film layer 10, a polyethylene terephthalate (PET) layer 20, a graphene layer 30, a pressure sensitive adhesive layer 40 and an easy release film layer 50.

In the present disclosure, a graphene layer is disposed on a PET layer. Due to excellent heat conduction and dissipation performance of graphene material, a backplate according to the present disclosure able to implement a function of a current backplate while having a heat dissipation function. A thickness of the added graphene layer is negligible relative to a thickness of the current backplate and a adds efficacy. Therefore, in a subsequent preparation process of a flexible display panel, the flexible display panel does not have to be disposed a current heat dissipation sponge copper layer to dissipate heat. Thereby reducing a thickness of the flexible display panel, and correspondingly reducing an elastic modulus of the flexible display panel, which greatly improves folding performance of the flexible display panel.

Figure 2:
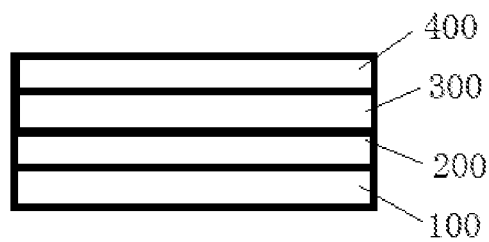
FIG. 2 is a schematic structural figure of a flexible display panel according to still another embodiment of the present disclosure.
Figure 3:
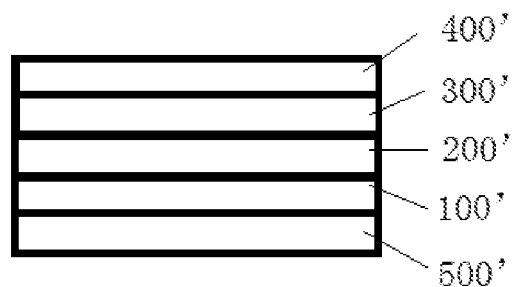
FIG. 3 is a schematic structural figure of a current flexible display panel involved in the prior art.

Referring to FIG. 2, still another embodiment of the present disclosure provides a flexible display panel, which is composed of a backplate 100 according to the present disclosure and an organic light emitting diode (OLED) layer 200, a touch layer 300 and a glass layer 400 which are sequentially disposed on the backplate.

The flexible display panel no longer needs to be provided with the current heat dissipation sponge copper layer disclosed in the prior art, thus an overall thickness of the flexible display panel is at least thinned relative to a current flexible display panel disclosed in the prior art more than 190 um, thereby reducing the elastic modulus of the flexible display panel according to the present disclosure, greatly improving product folding performance.

Correspondingly, since the flexible display panel of the present disclosure no longer needs to be provided with the current heat dissipation sponge copper layer for heat dissipation. The preparation process of the flexible display panel thereof omits a preparation step of the current heat dissipation sponge copper layer and a subsequent attachment to a back surface of the current flexible display panel, therefore simplify the process of the flexible display panel. At the same time, the flexible display panel does not need to be provided with material of a current heat dissipate sponge copper, which also reduces a cost of a product in a certain degree. Thereby improving a competitiveness of the product.

The present disclosure relates to the backplate and the flexible display panel thereof, wherein the backplate is provided with a novel material layer, the graphene layer, on the PET layer. So that the backplate has the function of the current backplate while additionally realizes the heat dissipation function. A thickness of the graphene layer is extremely limited compared to a thickness of the backplate. The graphene layer in the backplate can realizes the heat dissipation function realizes the heat dissipation function, as like the current heat dissipation sponge copper layer of the current backplate in the current flexible display panel can realize the heat dissipation function. Compared with the current flexible display panel, the flexible display panel have an effectively reduced thickness, thereby reducing an elastic modulus to a certain degree, and correspondingly improving folding performance.

The technical scope of the present disclosure is not limited only to the contents of the above description. Those skilled in the art can make different modifications and changes to the above-described embodiments without departing from the spirit and scope of the disclosure, and such different modifications and changes are within the scope of the present disclosure.

What is claimed is:

1. A backplate, comprising:
   a polyethylene terephthalate (PET) layer;
   a graphene layer disposed on the PET layer;
   a pressure sensitive adhesive layer disposed on the graphene layer;
   a first release film layer disposed on the pressure sensitive adhesive layer and is an easy release film layer; and
   a second release film layer disposed under the PET layer and is a heavy release film layer, wherein a release force on the heavy release film layer is greater than a release force of the easy release film layer.

2. The backplate as claimed in claim 1, wherein the graphene layer is formed on the PET layer by a deposition method.

3. The backplate as claimed in claim 2, wherein the graphene layer is formed on the PET layer by low pressure chemical vapor deposition method or standard atmospheric pressure chemical vapor deposition method.

4. A flexible display panel, comprising the backplate as claimed in claim 1.

5. The flexible display panel as claimed in claim 4, which is composed of the backplate and an organic light emitting diode (OLED) layer, a touch layer and a glass layer, which are sequentially disposed on the backplate.

* * * * *